United States Patent [19]
Dao et al.

[11] Patent Number: 5,347,487
[45] Date of Patent: Sep. 13, 1994

[54] BICMOS LATCH/DRIVER CIRCUIT, SUCH AS FOR A GATE ARRAY MEMORY CELL

[75] Inventors: Tim P. Dao, Coppell; Frank J. Svejda, Dallas, both of Tex.

[73] Assignee: Texas Instruments Incorporated, Dallas, Tex.

[21] Appl. No.: 708,944

[22] Filed: May 31, 1991

[51] Int. Cl.⁵ .................................................. G11C 7/00
[52] U.S. Cl. ............................ 365/189.05; 365/189.11
[58] Field of Search ................... 365/189.05, 189.06, 365/189.11, 225.6, 230.06

[56] References Cited

U.S. PATENT DOCUMENTS 4,995,001  2/1991  Dawson et al. ............... 365/190 X
5,093,806  3/1992  Tran ............................. 365/189.11

Primary Examiner—Steven Mottola
Attorney, Agent, or Firm—Wade James Brady; Mark A. Valetti; Richard L. Donaldson

[57] ABSTRACT

A BICMOS latch driver L/D is used to implement a BICMOS gate array memory cell (FIG. 2b). The memory cell includes a latch formed by cross-coupled invertors (INV1 and INV2). The driver stage is formed by an NPN transistor Q0 and an n-channel transistor MN3. The relatively stronger bipolar transistor is used to pull the output of the BICMOS latch/driver HI, while, for most applications, the relatively weaker n-channel device has sufficient strength to pull the output low. A WRITE port (WP) that interfaces to the WRITE bitline, and a READ port (RP) that interfaces to the READ bitline.

12 Claims, 1 Drawing Sheet 5,347,487

BICMOS LATCH/DRIVER CIRCUIT, SUCH AS FOR A GATE ARRAY MEMORY CELL

TECHNICAL FIELD OF THE INVENTION

The invention relates generally to integrated circuits, and more particularly relates to a BICMOS latch/driver circuit. In even greater particularity, the BICMOS latch/driver circuit can be used in a BICMOS gate array memory cell in which the driver includes an NPN bipolar transistor to pull the output HI and an n-channel transistor to pull the output LO.

BACKGROUND OF THE INVENTION

BICMOS integrated circuits incorporate bipolar transistors for functions requiring relatively high drive current, while still achieving the relatively high density and low power consumption available from CMOS technology.

The specific problem to which the invention can be applied is a gate array memory cell that does not require a complicated sense amp, and has sufficient drive current capability to permit a relatively large number of rows for each read bitline. Ideally, the memory cell would use a minimum number of transistors.

BICMOS gate arrays include base cells with a predetermined number of bipolar and CMOS transistors. For example, the TGB1000 Gate Array manufactured by Texas Instruments Incorporated includes a base cell with 18 transistors: six p-channel, ten n-channel, and two NPN.

FIGS. 1a and 1b illustrate two typical dual-port dual-invertor memory cell configurations such as might be implemented in a gate array base cell like that of the TGB1000. The memory cell in FIG. 1a uses eight CMOS transistors, including a two-transistor WRITE and READ transmission gates—it is disadvantageous in that it requires a relatively complicated sense amp and uses four vertical routing channels. The memory cell in FIG. 1b uses eleven CMOS transistors, and includes an output driver circuit—it is disadvantageous in that it has a relatively low drive capability (thereby limiting the number of rows on the read bitline).

In both cases, moreover, only one memory cell can be implemented in a single TGB1000 base cell—both configurations use six of the available ten n-channel transistors.

Accordingly, a need exists for a memory cell configuration that does not require a complicated sense amp, and has sufficient drive to permit a relatively large number of rows of memory cells for each read bitline.

SUMMARY OF THE INVENTION

The invention is a BICMOS latch/driver that uses a bipolar transistor in the driver stage to provide relatively high drive current using a relatively small total number of transistors- In an exemplary embodiment, the BICMOS latch driver is used in a gate array memory cell.

In one aspect of the invention, the BICMOS latch/driver includes a latch circuit, and a driver circuit with at least one bipolar transistor. The latch circuit latches data appearing on an input line. The driver circuit controls the state of the output line in accordance with the data in the latch circuit.

In another aspect of the invention, the BICMOS latch/driver is used to implement a BICMOS memory cell—a WRITE transmission gate is coupled between a WRITE bitline and the latch circuit, and a READ transmission gate circuit is coupled between the driver circuit and a READ bitline. The latch circuit latches data from the WRITE transmission gate, and the driver circuit (including at least one bipolar transistor) controls the state of the READ bitline through the READ transmission gate in accordance with the data in the latch circuit.

In an exemplary two-port BICMOS memory cell, the WRITE transmission gate and the READ transmission gate are implemented using CMOS transistors. The latch circuit is a conventional cross-coupled memory latch using two p-channel/n-channel MOS transistor pairs. The driver circuit comprises an NPN bipolar transistor and an n-channel MOS transistor coupled to one of the p-channel/n-channel pairs —the bipolar transistor is used to pull the READ bitline HI, while the n-channel transistor is used to pull the READ bitline LO.

The technical advantages of the invention include the following. The BICMOS latch/driver includes a bipolar transistor in the driver stage to provide significantly higher output drive current than would be available using only CMOS transistors. In one configuration, it requires only cross-coupled invertors coupled to an NPN/n-channel driver stage. In the driver stage, the stronger bipolar transistor can be used to pull the output HI, eliminating any need for an additional bipolar boost driver after the BICMOS latch/driver. In an exemplary BICMOS memory cell, the BICMOS latch/driver, together with associated WRITE and READ transmission gates, can operate without a complicated sense amp, with the bipolar/n-channel driver stage providing sufficient current drive to enable a relatively large number of rows of memory cells for each read bitline. In one configuration, the BICMOS memory cell uses only nine transistors—three p-channel, five n-channel, and one NPN —allowing two memory cells to be configured in a single eighteen transistor gate array base cell such as in the TGB1000.

BRIEF DESCRIPTION OF THE DRAWINGS

For a more complete understating of the invention, and for further features and advantages, reference is now made to the following Detailed Description of an exemplary embodiment of the invention, taken in conjunction with the accompanying Drawings, in which.

DETAILED DESCRIPTION OF THE INVENTION

The Detailed Description of an exemplary embodiment of the BICMOS latch/driver is organized as follows:

1. BICMOS Latch/Driver
2. Two-Port BICMOS Memory Cell
2.1. Latch/Driver
2.2. WRITE/READ Ports
3. Conclusion The exemplary two-port BICMOS memory cell incorporating the BICMOS latch/driver is configured for implementation in a gate array base cell. However, the invention has general applicability to any circuit incorporating the BICMOS latch driver with a bipolar transistor in the driver stage.

1. BICMOS Latch/Driver

The BICMOS latch/driver is a combination latch and driver that includes at least one bipolar transistor in the driver stage.

Figure 1A:
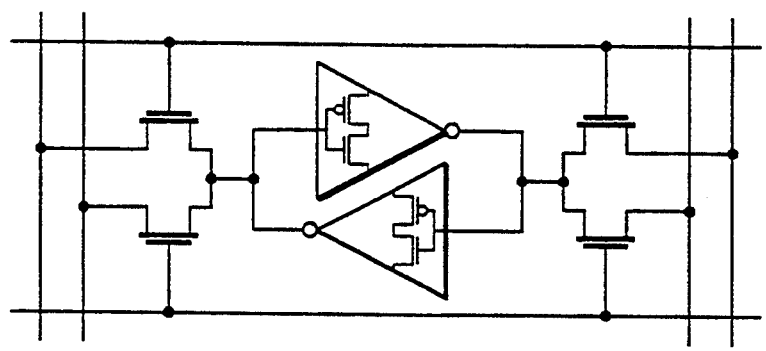
FIGS. 1a and 1b illustrate prior art memory cells used in gate array configurations.
Figure 1B:
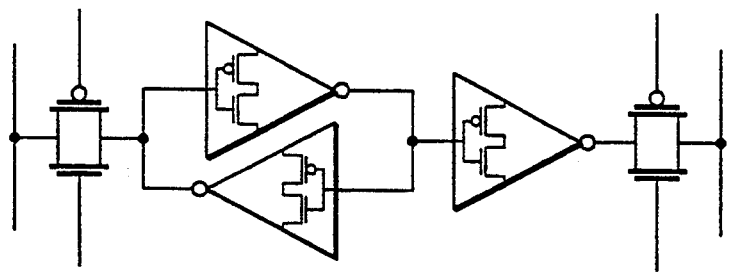
Figure 2A:
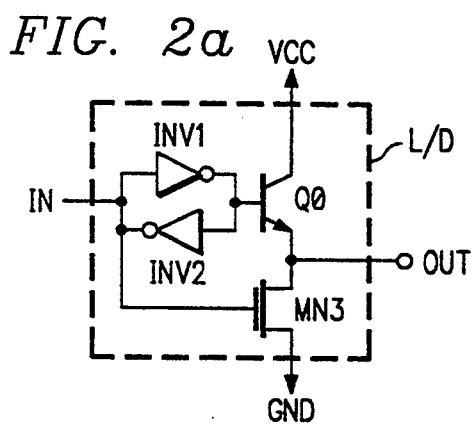
FIGS. 2a and 2b are respective functional illustrations of the BICMOS latch/driver circuit, and the exemplary BICMOS memory cell.

FIG. 2a illustrates a BICMOS latch driver L/D. It includes a latch formed by cross-coupled invertors INV1 and INV2. Typically, the invertor will be formed by a p-channel/n-channel pair of MOS transistors.

The driver stage is formed by an NPN transistor Q0 and an n-channel transistor MN3. The relatively stronger bipolar transistor is used to pull the output of the BICMOS latch/driver HI, while, for most applications, the relatively weaker n-channel device has sufficient strength to pull the output low.

2. Two-Port BICMOS Memory Cell

Figure 2B:
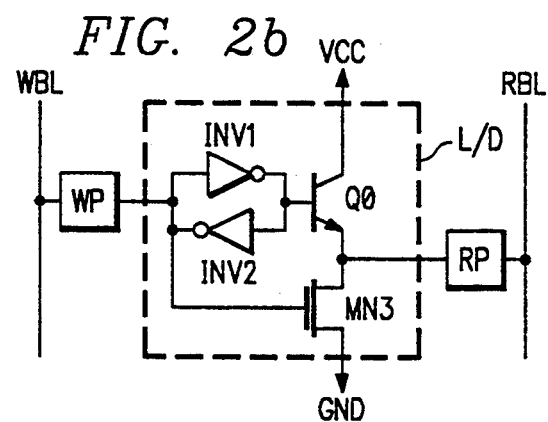

FIG. 2b illustrates the exemplary application of the BICMOS latch/driver in a two-port memory cell. The memory cell includes the basic BICMOS latch/driver circuit L/D together with a WRITE port WP that interfaces to the WRITE bitline, and a READ port RP that interfaces to the READ bitline.

As an alternative to the two-port BICMOS memory cell, the BICMOS latch/driver circuit can be used in a single-port BICMOS memory cell arrangement. In this configuration, the read and write bitlines of the memory are coupled together.

Figure 3:
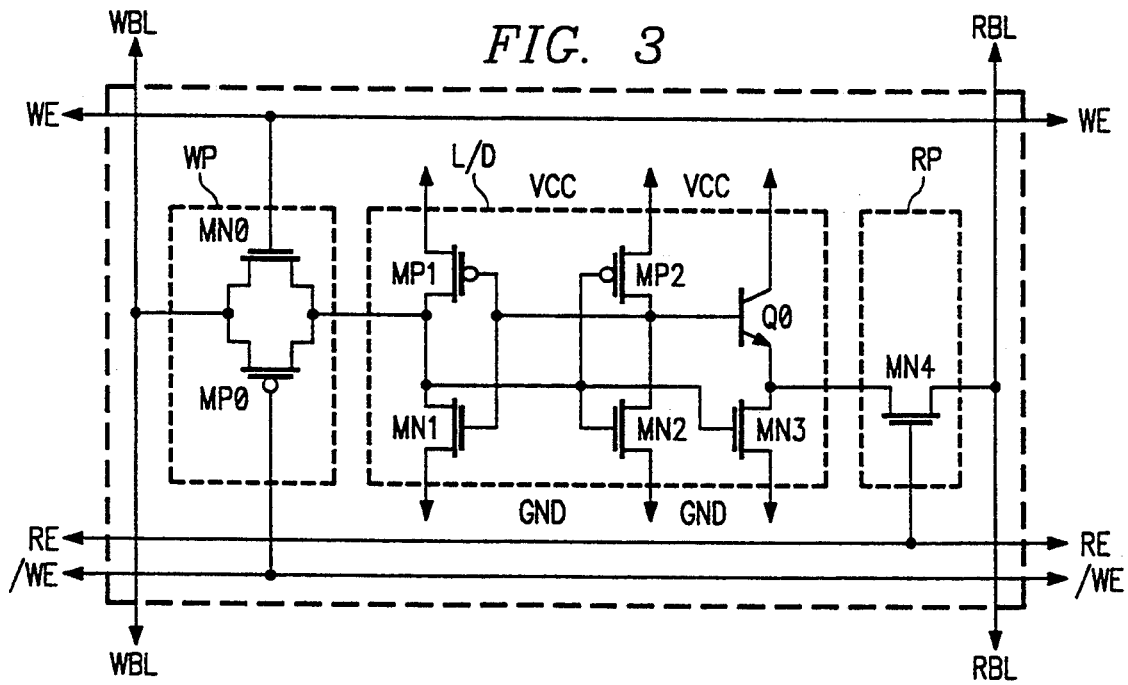
FIG. 3 is a schematic illustration of the exemplary two-port BICMOS memory cell.

FIG. 3 provides a schematic illustration of the exemplary two-port BICMOS memory cell, such as might be implemented in a BICMOS gate array base cell. WRITE port WP interfaces latch/driver L/D to a write bitline WBL, and READ port RP interfaces the latch/driver to a read bitline RBL.

2.1. Latch/Driver

The latch/driver L/D includes a conventional cross-coupled memory latch formed by p-channel/n-channel invertors MP1/MN1 and MP2/MN2.

Bipolar NPN Q0 and NMOS transistor MN3 form a BICMOS driver/buffer stage. The bipolar transistor is used to pull the read bitline RBL HI, while the NMOS transistor is used to pull the read bitline LO.

By using the bipolar transistor in the driver stage, read access time is reduced relative to CMOS configurations. Moreover, the BICMOS memory cell is able to drive a read bitline that serves a relatively large number of rows of memory cells without special boost drive circuitry or a complicated sense amp.

2.2. WRITE/READ Ports

The WRITE port WP comprises transistors MN0 and MP0, forming a CMOS transmission gate that couples the latch/driver L/D to the write bitline WBL. Data is written into the latch by placing a logic value of HI or LO on the write bitline, and enabling the WRITE port from the write enable line WE and the write enable complement line /WE.

Alternatively, the WRITE port could be formed using a single NMOS pass gate. Using a single pass gate would reduce the number of transistors, but would correspondingly degrade performance by increasing write time.

The READ port comprises an NMOS transistor MN4, forming a pass gate that couples the latch/driver L/D to the read bitline RBL. The contents of the latch can be read (sensed) from the logic value output and placed on the read bitline when the READ port is enabled from the read enable bitline RE.

3. Conclusion

Although the Detailed Description of the invention has been directed to certain exemplary embodiments, various modifications of these exemplary embodiments, as well as alternative embodiments, will be suggested to those skilled in the art. It is to be understood that the invention encompass any modifications or alternative embodiments that fall within the scope of the appended Claims.

What is claimed is:

1. A BICMOS memory cell that stores a data bit value from a WRITE bitline, and makes that data bit value available at a READ bitline comprising:
    a WRITE transmission gate coupled to receive data from the WRITE bitline;
    a READ transmission gate coupled to output data onto the READ bitline;
    a latch circuit for latching data from the WRITE input circuit; and
    a driver circuit including at least one NPN bipolar transistor for pulling the READ bitline HI through a READ transmission gate in accordance with the data in the latch circuit driver circuit and an n-channel transistor for pulling the READ bitline LO.

2. The BICMOS memory cell of claim 1, wherein said latch circuit is configured using CMOS transistors.

3. The BICMOS memory cell of claim 2, wherein said latch circuit comprises two invertors.

4. The BICMOS memory cell of claim 1, wherein said WRITE transmission gate comprises two MOS transistors.

5. The BICMOS memory cell of claim 1, wherein the memory cell is included in a two-port memory array.

6. The BICMOS memory cell of claim 1, wherein the memory cell is configured in a gate array base cell.

7. A BICMOS memory array that stores a data bit values in memory cells, comprising:
    at least one WRITE bitline;
    at least one READ bitline;
    multiple memory cells, each coupled between the WRITE and READ bitlines, for storing data bit values that are written from the WRITE bitline and read out onto the READ bitline;
    each memory cell including a driver circuit with at least one NPN bipolar transistor for pulling the READ bitline HI in accordance with the data stored in the memory cell and an n-channel transistor for pulling the READ bitline LO.

8. The BICMOS memory array of claim 7, wherein each memory cell further comprises:
    a WRITE transmission gate coupled to receive data from the WRITE bitline;
    a READ transmission gate coupled to output data onto the READ bitline; and
    a latch circuit for latching data from the WRITE transmission gate.

9. The BICMOS memory array of claim 8, wherein said WRITE transmission gate comprises two MOS transistors.

10. The BICMOS memory array of claim 1, wherein the memory array is a two-port memory array.

11. A method of implementing a BICMOS memory cell that stores a data bit value from a WRITE bitline, and makes that data bit value available at a READ bitline, comprising the steps:

latching data received from the WRITE bitline; and
    for READ operations, either pulling the READ bitline HI using an NPN bipolar transistor; or
    pulling the READ bitline LO using an n-channel MOS transistor.

12. A two-port BICMOS memory cell that stores a data bit value from a write bitline and makes that data bit value available at a read bitline, said memory cell comprising:

a write enable line, said write enable line for enabling data to be written into said memory cell;
    a read enable line, said read enable line for enabling data to be read from said memory cell;
    a write port, said write port connected to said write enable line and said write bitline and comprised of a CMOS transmission gate;
    a read port, said read port connected to said read enable line and said read bitline and comprised of at least one NMOS transistor; and
    a latch/drive circuit, said latch/drive circuit connected to said write port and said read port and comprised of a bipolar transistor, an NMOS transistor, and a cross-coupled memory latch;
    wherein the collector of said bipolar transistor is connected to a supply voltage, the emitter of said bipolar transistor is connected to the source of said NMOS transistor and said read port, and the drain of said NMOS transistor is connected to ground.

* * * * *